April 30, 1957 M. B. PRINCE 2,790,940

SILICON RECTIFIER AND METHOD OF MANUFACTURE

Filed April 22, 1955

INVENTOR
M. B. PRINCE
BY D. H. Wilson, Jr.
ATTORNEY

United States Patent Office 2,790,940

Patented Apr. 30, 1957

2,790,940

SILICON RECTIFIER AND METHOD OF MANUFACTURE

Morton B. Prince, New Providence, N. J., assignor to Bell Telephone Laboratories, Incorporated, New York, N. Y., a corporation of New York Application April 22, 1955, Serial No. 503,299

15 Claims. (Cl. 317—234)

This invention relates to silicon rectifiers suitable for handling high levels of current wherein rectification occurs at the interfacial region between regions of material of *n* and *p* conductivity type.

One aspect of this invention involves an improvement of the silicon rectifiers disclosed in the applications of G. L. Pearson, Serial No. 414,275 filed March 9, 1954, and Serial No. 491,908 filed March 3, 1955. This improvement resides in the incorporation of features into rectifier structures of these general forms, enabling these structures to operate in the forward direction utilizing the mechanism of conductivity modulation. Rectifiers of this type will pass current densities in the forward direction at least an order of magnitude greater than achieved heretofore.

A rectifier comprising a region of *n* conductivity type contiguous with a region of *p* conductivity type and provided with suitable low resistance connections to each region is ordinarily provided with one region of substantially greater resistivity than the other in order to achieve the desired reverse characteristics. In the usual silicon rectifier, the forward current is limited by the resistance of the region of higher resistivity material. This resistance is reduced to a low level in silicon according to this invention by reducing the thickness of this region and maintaining a higher minority carrier lifetime therein than heretofore. By a proper correlation of thickness and carrier lifetime a substantial portion of the minority charge carriers injected across the forward biased junction and into the high resistivity region flow across the entire region. The resistivity during the interval of forward bias across the junction and the effective resistance of the region is decreased by the extra mobile carriers therein. Thus, the higher the current density passing through the device in the forward direction the higher will be the mobile carrier densities and the lower will be the effective resistance of the normally higher resistivity region. A device of this nature wherein this mechanism functions exhibits a voltage drop across the high resistivity region in the forward direction which is almost independent of the current flowing therethrough.

The invention is also predicated in part upon the discovery that the usual degradation in minority carrier lifetime in silicon, occurring when the silicon body is subjected to elevated temperatures, is recovered partially in material which has been heated and is less severe in material which has not been heated when it is formed into bodies of 10 mils or less thickness and subjected to high temperatures. Hence, the fabrication of rectifiers from such thin silicon bodies enables thin, high resistivity regions to be obtained in which the minority carrier lifetime is sufficient so that the conductivity modulation mechanism functions.

Heretofore it has been suggested that the separation of the terminal portions of a rectifier is significant in the operating characteristics. In particular, with regard to germanium, it has been observed that a better quality rectifier can be obtained if the terminal regions are separated by higher resistivity material by about 40 mils.

Silicon devices of the prior art have been constructed without regard to the width of the region between the device terminals. It has been observed in processing the silicon presently available that temperatures in excess of about 700° C. degrade the minority carrier lifetime to about 0.1 microsecond or less. Minority charge carriers injected into this low lifetime material recombine essentially at the point of injection. Accordingly, no appreciable conductivity modulation occurred in prior silicon rectifiers.

According to this invention it has been discovered that lifetimes of one or two microseconds can be obtained in completed silicon devices even when the silicon is subjected to temperatures in excess of 1200° C., provided the material initially had a lifetime in excess of five microseconds, was limited in its thickness to less than 10 mils, and was heated to these elevated temperatures as a body less than 10 mils thick. It was further discovered that the utilization of these thin bodies in the manufacture of silicon rectifiers wherein a high resistivity layer was positioned between high conductivity layers of opposite conductivity type enabled the mechanism of conductivity modulation to function across the entire layer and thereby greatly enhanced the power handling capacity of the unit.

In accordance with the above, one object of this invention is to enhance the electrical characteristics of silicon rectifiers and particularly to reduce their resistance in the forward direction of conduction, to introduce the mechanism of conductivity modulation into silicon rectifiers, to increase the level of forward currents passed by silicon rectifiers, to reduce the power dissipated therein when passing forward currents, and to eliminate to a substantial degree the dependence of the forward resistance of silicon rectifiers upon the resistivity of the material therein, thereby enabling rectifiers of high power handling capacity to be fabricated with any of a wide range of reverse characteristics.

Another object of this invention is to facilitate the manufacture of silicon rectifiers.

A still further object is to increase the minority carrier lifetime in heat treated silicon material.

This invention and the objects and features thereof will be more fully appreciated from the following detailed description when read in conjunction with the accompanying drawings, in which.

Figure 1:
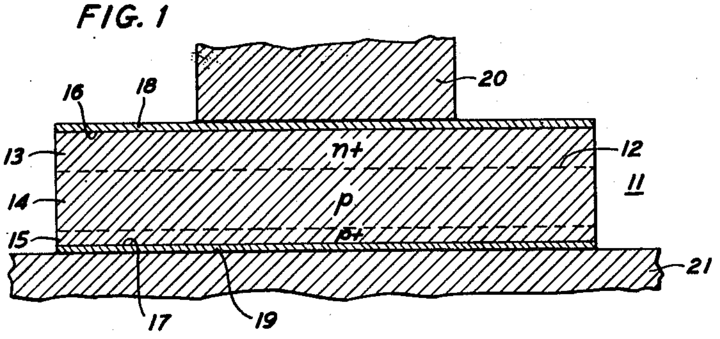
Fig. 1 shows a sectioned elevation of a portion of a typical silicon rectifier constructed according to the invention.

A rectifier element typical of the invention is shown in Fig. 1. It comprises a wafer-shaped silicon body 11 containing an *n—p* junction 12 which is substantially normal to the thickness dimension of the wafer at the interface between regions 13 and 14 of opposite conductivity type therein. The region 13 adajcent the wafer surface is formed of relatively high conductivity material, having a resistivity of less than 0.01 ohm-centimeter in order to provide a high conductivity terminal region to which a suitable low resistance electrical connection can be made. A second terminal region 15 of high conductivity material of the same conductivity type as region 14 is contiguous with intermediate region 14 on the major face of the wafer opposite that supporting region 13 to enable a low resistance connection to be made thereto. Low resistance substantially ohmic connections are made to the faces 16 and 17 of body 11 by applying layers 18 and 19 thereto of some material such as rhodium, zirconium hydride, or nickel, for example, in the manner disclosed in Biondi-Cleveland-Sullivan application Serial No. 472,026 filed November 30, 1954, or Johnston-Rulison application Serial No. 503,230 filed herewith. Metallic conductors 20 and 21 can be soldered to layers 18 and 19 to provide highly conductive leads to the rectifying region of body 11.

The reverse characteristics of the rectifier in the main are dependent upon the nature of the intermediate region 14. As is well known, the resistivity of this region determines to a large extent the reverse current which passes across the junction. The conductivity type of the material in region 14 can be either intrinsic, near intrinsic, or extrinsic *n*- or *p*-type. Where high reverse breakdown voltages are sought, it is advantageous for a given resistivity of extrinsic material to employ *n*-type material. Further, as is well known, the breakdown voltage is dependent upon the impurity center concentration gradient across the junction. In practice the rectifiers of this invention utilize an intermediate zone 14 of greater than 0.1 ohm-centimeter resistivity.

The forward characteristics of rectifiers are made up of a number of resistances in series. The terminal resistance is made up of the bulk resistance of conductors 20 and 21, layers 18 and 19, the interfacial regions including the solder bonds between these conductors and layers, the bulk resistivity of the semiconductive terminal zones 13 and 15, and the interfacial regions between the layers and zones. All of these resistances are quite small. The resistance of the intermediate semiconductive zone 14 has heretofore been appreciable in silicon devices since this zone has been 20 or 30 mils thick and its minority carrier lifetime less than 0.1 microsecond. In the present rectifier structure the thickness of this region has been restricted and a higher minority carrier lifetime established so that a substantial portion of the charge carriers will penetrate it before recombining. When operated at high levels of injected carriers as a power rectifier, this penetration can be attributed to a combination of diffusion and drift. Thus, the thickness of the intermediate zone 14 at forward current densities of the order of hundreds of amperes per square centimeter can be several times the average distance a minority charge carrier will diffuse from the forward biased *n*—*p* junction, a diffusion length, L, which can be defined as $\sqrt{Dt}$, where D is the diffusion constant of a hole in *n* conductivity type material (about 25 cm.$^2$/sec.) or an electron in *p* conductivity type material (about 10 cm.$^2$/sec.), and *t* is its lifetime. In practice it has been found that silicon rectifiers according to this invention having a high resistivity region 14 ranging in thickness from greater than four mils down to a distance exceeding the space charge penetration at the reverse biased junction operate in the forward direction of conduction with a resistance contribution by this region which is so small as to be essentially negligible.

This phenomena of low forward resistance is attributed to the mechanism of conductivity modulation. Considering a structure in which region 13 is $n^+$ or high conductivity *n*-type, region 14 is high resistivity *p*-type and is thin, and region 15 is $p^+$ or high conductivity *p*-type, when the device is biased in the forward direction, electrons from the heavily doped $n^+$ region will be injected into the very lightly doped *p* region. If the lifetime for these electrons in the *p* region is long enough, the electrons will diffuse across the *p* region and reach the $p^+$ region with little recombination. In order to maintain electrical neutrality, holes will be injected into the *p* region from the $p^+$ region. These extra mobile carriers (both electrons and holes) will reduce the effective resistance of the *p* layer and thus decrease the voltage drop across this layer. The higher the current density, the higher will be the injected mobile carrier densities and therefore, the lower will be the effective resistance and the greater the distance over which appreciable conductivity modulation is observed. This effect will tend to make the voltage drop across the *p* region almost independent of the current.

Figure 4:
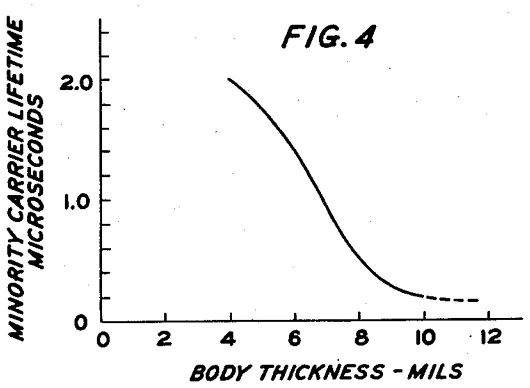
Fig. 4 is a curve showing the relationship between body thickness and final minority carrier lifetime for silicon material of a fixed conductivity and lifetime subjected to a heat treating temperature of 1100° C. for two hours.

In view of the ambipolar character of the conductivity modulation in the high resistivity region of the rectifier, the duffusion constants of both electrons and holes must be considered in determining the thickness which can be modulated. A mean diffusion constant of about 17 cm.$^2$/sec. is applicable in evaluating this mechanism. The diffusion length is the average distance along a given direction which a charge carrier will diffuse before recombining. Accordingly, at high carrier injection densities the increase in carriers is effective for conductivity modulation over several diffusion lengths. The length of ambipolar carrier diffusion can be determined from the lifetime of the carriers as shown in Fig. 4. When a four mil silicon body is processed according to this invention, its two microsecond lifetime provides a diffusion length of $\sqrt{17 \cdot 2 \cdot 10^{-6}} = 5.8 \times 10^{-3}$ cm. = 2.3 mils and conductivity modulation has been obtained across about three mils or one and a third lengths of ambipolar diffusion. In another case, at higher forward currents, for example at 20 to 50 amperes per square centimeter, a six mil silicon body having a 1.4 microsecond lifetime and a diffusion length of about 1.9 mils for ambipolar diffusion has been conductivity modulated at current densities of about 20 to 50 amperes per square centimeter across a high restivity region about four mils thick or greater than two diffusion lengths. At higher current densities, several hundred amperes per square centimeter, a higher level of conductivity modulation has been observed and thicker high resistivity regions could be modulated. However, it must be kept in mind that this mechanism relies upon maintaining a reasonable level of carrier lifetime in the material and hence even at these high levels of current density the over-all thickness of the structures are limited as discussed below.

Figure 2:
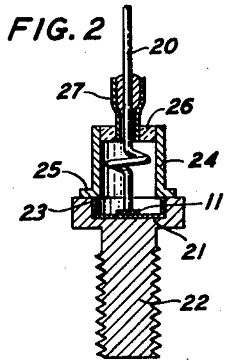
Fig. 2 is a sectioned elevation of a typical rectifier unit structure including the portion shown in Fig. 1.

A specific form of a rectifier unit manufactured in accordance with this invention is shown in Fig. 2. It comprises a rectifier body 11, as shown in Fig. 1, having a thickness of about four and one-half mils and a square surface area over its major faces 100 mils on a side. The silicon wafer is provided with an intermediate *p*-type zone 14 of about 25 ohm-centimeters resistivity about two and one-half mils thick, an *n*-type terminal zone on one surface 13 about one and one-half mils thick having a resistivity at its surface 16 of less than 0.01 ohm-centimeter, and a *p*-type terminal zone on its opposite major surface about one-half mil thick having a restivity at its surface 17 of less than 0.01 ohm-centimeter.

The surface layers 18 and 19 on zones 13 and 15, respectively, are of nickel. These surface layers are soldered to conductors with a 310° C. lead-tin solder containing one per cent tin. The conductors attached to the surface layers 18 and 19 are in the form of a copper wire 20 having a diameter of 32 mils. The conductor 21 is a copper layer which may be plated or braced to a massive steel stud 22 functioning to provide a heat sink and means of conducting the heat generated in operation away from the silicon body 11, for example by being secured to a large area metallic chassis which functions as a cooling fin.

The stud 22, by virtue of cavity 23 in its upper surface, functions as a housing for the rectifier unit in combination with a cylindrical metallic eyelet 24 having a flange 25 on it lower periphery welded, soldered, or otherwise secured to the periphery of cavity 23. The rectifier structure is protected from adverse effects of any external contaminating medium by a seal established between the upper portion of eyelet 24 and conductor 20. This seal may conveniently be in the form of a fused glass mass 26.

Figure 3:
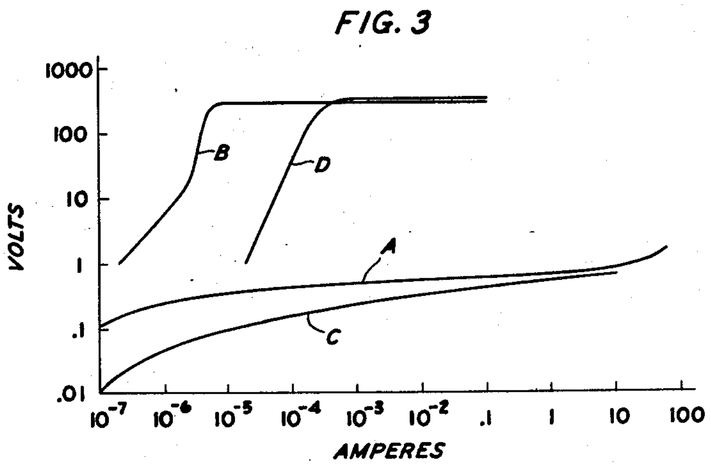
Fig. 3 is a log-log plot of the forward and reverse voltage-current characteristics of a typical unit of the type shown in Fig. 2.

The forward and reverses current characteristics of the units described above and shown in Fig. 2 when operated at 25° C. are shown in curves A and B, respectively, while similar curves at an operating temperature of 125° C. are shown in curves C and D, respectively, of Fig. 3. It is seen that even at 25° C. more than 30 amperes are passed in the forward direction with a one volt drop across the rectifier. A unit of this type and size has passed a sustained forward current of 10 amperes for thousands of hours. In the reverse direction a breakdown voltage of 300 volts was obtained in this unit.

In practice rectifiers of this invention can be fabricated from single crystal silicon material having a conductivity type and resistivity corresponding to that desired in the intermediate region 14 of the ultimate device. Such single crystal bodies can be produced by withdrawing a single crystal seed from a molten mass of silicon at a rate which permits material to solidify at the seed-melt interface with the same crystal orientation as the seed in accordance with the techniques disclosed in the application of J. B. Little et al. Serial No. 138,354 filed January 13, 1950, or by establishing a molten zone on a single crystal seed face and gradually adding material to that molten zone as material is frozen therefrom onto the seed face in the manner disclosed in H. C. Theuerer application Serial No. 326,561 filed December 17, 1952.

The device whose characteristics are shown in Fig. 3 is fabricated by slicing a single crystal of *p* conductivity type silicon having 25 ohm-centimeters resistivity and a minority carrier lifetime of 20 microseconds to a thickness of about 10 or 12 mils. The surfaces of this slice are lapped abrasively, for example with a No. 600 aluminum oxide. Phosphorus is diffused into the wafer faces from an atmosphere of phosphorus pentoxide in accordance with the process set forth in Derick-Frosch application Serial No. 477,535 filed December 24, 1954. The diffusion of phosphorus to a depth of about one and one-half mils over the entire exposed surface of the slice is achieved by heating phosphorus pentoxide powder to 175° C., mixing the vapor evolved with pure dry nitrogen at atmospheric pressure flowing at a rate of 1000 cubic centimeters per minute, and maintaining the wafer in the mixture at 1200° C. for an interval of 16 hours.

The resulting wafer at this point in its fabrication has its opposed major surfaces converted to *n* conductivity type silicon by the predominance of donor centers introduced through the phosphorus diffusion process. These surface regions contain decreasing concentrations of phosphorus which are a maximum at their surfaces and of such a concentration at the surface that the semiconductor may become degenerate and in any event has a conductivity of at least 1000 $\text{ohms}^{-1}$ $\text{centimeters}^{-1}$.

The unconverted central *p* region is about seven mils thick at this point in the fabrication and, due to the sustained high temperatures to which the body has been subjected, the lifetime of minority charge carriers, electrons, in this region has been degraded to less than 0.1 microsecond.

The next step in fabricating the body is to reduce its thickness, for example by abrading to about four and one-half mils by removing material from one face of the slice. At this point the structure consists of a four and one-half mil thick slice having a one and one-half mil diffused phosphorus surface on one face and a three mil thick *p*-type layer extending to the opposite face. A high conductivity *p*-type surface film is applied to this opposite face by diffusing a high concentration of boron into that face. This boron diffusion step can be practised by heating the slice to about 1100° C. in nitrogen at atmospheric pressure flowing at a rate of 1000 cubic centimeters per minute, mixing boron trichloride with the nitrogen at a rate of 25 cubic centimeters per minute for one-half minute, flowing the mixture over the slice while it is heated to decompose the trichloride and deposit boron thereon, and maintaining the slice at a temperature of about 1100° C. over an interval of about two hours to diffuse the boron into the *p*-type layer. The slice is cooled to room temperature over a ten minute interval by one or more steps involving moving it to cooler portions of the furnace. This results in a high conductivity *p*-type layer about one-half mil thick extending into the *p*-type surface and exhibiting a gradation in acceptor predominance similar to the gradation in donor predominance in the diffused *n*-type surface layer whereby the surface of the region is of the highest conductivity, again at least 1000 $\text{ohms}^{-1}$ $\text{centimeters}^{-1}$. This diffusion process is not detrimental to the high conductivity *n*-type surface layer on the opposite face of the wafer since, as set forth in the above-mentioned Derick-Frosch patent application, the phosphorus thereon functions as a mask, preventing the penetration of boron into the silicon.

This process of fabrication produces an unexpected result which would not be anticipated from previous experience with silicon body treatments, namely the minority carrier lifetime in the intermediate region of higher resistivity is appreciably enhanced. The degree of this enhancement depends upon the thickness of the body to which the heat treatment was applied and the initial minority carrier lifetime of that body. Thus, as shown in Fig. 4, the processing of a *p*-type silicon body of 25 ohm-centimeters resistivity having a minority carrier lifetime of 20 microseconds, as initially derived from the pulled crystal and prior to any heat treating process, can be rejuvenated from less than 0.2 microsecond lifetime, the limit of the measuring equipment employed in this investigation, to greater than two microseconds.

The thermally degraded minority carrier lifetime in silicon can be enhanced by reducing the thickness of the silicon to less than 10 mils and heating it in excess of 750° C. without practicing any diffusion step. Further, the thermal degradation of lifetime can be limited by thinning the silicon prior to heating it in excess of 750° C., thereby eliminating the need for the thinning operation subsequent to the high temperature treatment, and where other considerations dictate only a single heat treatment, eliminating the second heating operation.

As may be seen from the curve there is an inverse relation between body thickness and minority carrier lifetime which is effective on bodies of less than 10 mils thickness. Carrier lifetime enhancement is realized in this manner in the thinned silicon bodies being processed for rectifier use during the heat treatment incidental to the boron diffusion step. This increase in lifetime, together with the high current densities of forward operation of the rectifier and the thickness of the intermediate region, result, as discussed above, in conductivity modulation of that region and thus an order of magnitude increase in the power handling capacity of the rectifier.

A coating of nickel is applied to both high conductivity surfaces of the slice initially as a nickel flash from a solution of 105 grams of nickel and ammonium sulphate, 15 grams ammonium chloride, and 15 grams boric acid, dissolved in one liter of distilled water at a current density of about 0.10 $\text{ampere/cm.}^2$ for an interval of 45 seconds. This flash is applied to surfaces which have been prepared by washing first in concentrated nitric acid, then in hydrofluoric acid, rinsing in water, and abrading lightly with No. 1800 alundum. The nickel flash is then cleaned by immersing the slice in boiling water and heated to 800° C. for one-half minute in a nitrogen atmosphere, care being exercised to avoid thermal shock in the slice by inserting and withdrawing it from the hot zone of the furnace slowly. Again, due to the thinness of the slice, this heat treatment does not adversely affect the minority carrier lifetime of the intermediate zone 14. A second layer of nickel is then deposited at the same current density for about 30 seconds in the nickel plating solution to give a clean surface which reduces the surface resistance and is suitable for soldering.

The plated silicon slice is then divided into wafers, in the embodiment under discussion, wafers 100 mils on a side. This is accomplished by heating a supporting plate and melting a mixture of rosin and beeswax thereon to provide an adhesive bond for the slice. While the rosin and beeswax mixture is molten the slice is placed in it and a second layer of the mixture is spread over the exposed face of the slice. It is then mounted in a suitable sawing apparatus and cut into wafers with a diamond saw. In order to insure that the debris along the edges of the saw kerf will not detrimentally affect the characteristics of the $n$—$p$ junction at the wafer edges, these edges are subjected to an etchant consisting of 15 parts hydrofluoric acid and 85 parts nitric acid while the major surfaces are protected by the rosin and beeswax mixture. The etched wafers are then rinsed and removed from the mounting plate by softening the rosin-beeswax mixture and cleaning it from their surfaces. Each wafer is then secured in a suitable structure which provides a mechanical support and an electrical connection to each of the plated nickel surfaces.

As the rectifier is expected to operate at temperatures up to 200° C. the conductors 20 and 21 are secured to the nickel faces 18 and 19 by a solder having a 310° C. melting point. This solder may be applied with or without a rosin flux.

In the device of Fig. 2, the structure is completed by mounting the eyelet 24 to which the glass bead 26 and metal tubulation 27 are sealed over the structure. This is done by threading the lead 20 through the tubulation, soldering the flange of the eyelet to the periphery of cavity 23, and sealing the tubulation to the conductor 20 by a crimping and soldering operation.

It is to be understood that the disclosed embodiments are illustrative of the principles of the invention. Numerous other techniques and arrangements may be devised by those skilled in the art without departing from the spirit and scope of the invention. For example, acceptors other than phosphorus, such as arsenic, antimony, and bismuth, and donors such as aluminum, gallium, indium, and lithium can be diffused into the silicon. Further, while the specific rectifier discussed is about 5 mils or less in thickness, it is to be understood that thicker silicon bodies can be employed and thicker terminal regions applied to their surfaces whereby the width of the high conductivity intermediate region is limited to that across which the conductivity modulation mechanism functions.

What is claimed is:

1. A rectifying element comprising a monocrystalline body of silicon less than 10 mils thick having along its thickness dimension an intermediate zone having a conductivity which is low with respect to adjacent zones, a first terminal zone of one conductivity type contiguous with said intermediate zone and having a conductivity which is high with respect to said intermediate zone, and also contiguous with said intermediate zone a zone of conductivity type opposite that of said first terminal zone having a conductivity which is high with respect to said intermediate zone.

2. A rectifying element comprising a monocrystalline body of silicon less than 10 mils thick having along its thickness dimension an intermediate zone of one conductivity type which is of low conductivity with respect to adjacent zones, a first terminal zone of said one conductivity type contiguous with said intermediate zone and having a conductivity which is high with respect to said intermediate zone and also contiguous with said intermediate zone a zone of conductivity type opposite that of said first terminal zone having a conductivity which is high with respect to said intermediate zone.

3. A rectifying element comprising a monocrystalline body of silicon less than 10 mils thick having along its thickness dimension an intermediate zone about 4 mils or less thick having a conductivity which is low with respect to adjacent zones, a first terminal zone of $n$-conductivity type on one major face of said body contiguous with said low conductivity intermediate zone having a conductivity which is high with respect to the intermediate zone and a second terminal zone of $p$-conductivity type also contiguous with said low conductivity zone on an opposite face of said body having a conductivity which is high with respect to said intermediate zone.

4. A rectifier in accordance with claim 3 wherein said terminal zones have a conductivity of at least 1000 $ohms^{-1}$ $centimeters^{-1}$.

5. A rectifying element comprising a monocrystalline body of silicon less than 10 mils thick having along its thickness dimension a first $p$-conductivity type zone about 4 mils or less thick having a conductivity which is low with respect to adjacent zones, a first terminal zone on one major face of said body and contiguous with said low conductivity zone, said first terminal zone being of $n$-conductivity type having a conductivity which is high with respect to said first $p$ zone, and a second terminal zone of $p$-conductivity type having a conductivity which is high with respect to said first low conductivity zone and which is on an opposite face of said body and contiguous with said low conductivity zone.

6. A rectifying element comprising a monocrystalline body of silicon less than 10 mils thick having along its thickness dimension a first $n$-conductivity type zone about 4 mils or less thick having a conductivity which is low with respect to adjacent zones, a first terminal zone on one major face of said body and contiguous with said low conductivity zone of $n$-conductivity type having a conductivity which is high with respect to said first $n$ zone, and a second terminal zone of $p$-conductivity type having a conductivity which is high with respect to said low conductivity zone on an opposite face of said body and contiguous with said low conductivity zone.

7. A rectifying element comprising a monocrystalline body of silicon less than 10 mils thick, a first zone on one face of said body containing a diffused acceptor impurity as the predominant conductivity type determining constituent, a second zone on the opposite face of said body containing a predominance of a conductivity type determining impurity characteristic of the type opposite that in said first zone and a third zone intermediate and contiguous with said first and second zones, said intermediate zone having a conductivity which is low with respect to said terminal zones and separating said terminal zones by about 4 mils or less.

8. A high power silicon rectifier comprising a monocrystalline silicon body having a thickness of less than 10 mils, a first terminal layer of $n$ conductivity type on one surface of said body containing diffused phosphorus, a second terminal layer of $p$ conductivity type on an opposite face of said body containing diffused boron, and a third layer intermediate and contiguous with said terminal layers of $p$ conductivity type, said third layer having a conductivity which is low with respect to said terminal layers and having a thickness of about four mils or less.

9. A high power silicon rectifier comprising a monocrystalline silicon body having a thickness of less than 10 mils, a first terminal layer of $n$ conductivity type on one surface of said body containing diffused phosphorus, a second terminal layer of $p$ conductivity type on an opposite face of said body containing diffused boron, a third layer intermediate and contiguous with said terminal layers of $p$ conductivity type, said third layer having a conductivity which is low with respect to said terminal layers and having a thickness of about four mils or less, and a multilayer nickel contact applied on the surface of each of said terminal zones.

10. A rectifying element comprising a monocrystalline body of silicon less than about 5 mils thick, an *n*-conductivity type terminal zone on one face of said body having a thickness of about one and one-half mils and containing diffused phosphorus as the predominant conductivity type determining impurity, a *p*-conductivity type terminal zone having a thickness of about one-half mil on the opposite face of said body and containing a predominance of diffused boron as the conductivity type determining impurity, and a *p*-conductivity type layer intermediate and contiguous with said terminal zones having a conductivity which is low with respect to said terminal zones and having a thickness less than about 3 mils.

11. In the process of manufacturing a silicon rectifier, the steps which comprise fabricating a *p*-type monocrystalline body having a bulk resistivity of about 25 ohm-centimeters and a minority carrier lifetime of at least five microseconds to a thickness of about 10 mils, diffusing phosphorus into the major surfaces of said body at a temperature of about 1200° C. over an interval of about 16 hours, removing material from one major face of the body to reduce the body thickness to about five mils, and diffusing boron into said one major face of said body at a temperature of about 1100° C. over an interval of about two hours.

12. In the process of manufacturing a silicon rectifier, the steps which comprise fabricating a monocrystalline silicon body having a bulk resistivity in excess of 0.1 ohm-centimeter and a minority lifetime of at least five microseconds to a thickness of greater than about 10 mils, diffusing a conductivity type determining impurity into one face of said body at a temperature in excess of 750° C., removing material from a second face of said body to reduce the thickness to less than 10 mils, and diffusing a conductivity type determining impurity characteristic of the conductivity type opposite that associated with said first-mentioned impurity into said second face of said thinned body at a temperature in excess of 750° C.

13. In the process of manufacturing a silicon rectifier, the steps which comprise fabricating a *p* conductivity type monocrystalline silicon body having a bulk resistivity in excess of 0.1 ohm-centimeter and a minority carrier lifetime of at least five microseconds to a thickness of greater than about 10 mils, diffusing phosphorus into the major surfaces of said body at a temperature of about 1200° C., removing material from one major face of said body to reduce the thickness to less than 10 mils, and diffusing boron into said one major face of said thinned body at a temperature of about 1100° C.

14. In the process of manufacturing a silicon body wherein derogation in minority carrier lifetime normally occurs when said body is subjected to elevated temperatures, the method of enhancing the minority carrier lifetime of the material which comprises thinning the body to less than 10 mils and subjecting the thinned body to a temperature in excess of 750° C.

15. In the process of manufacturing a silicon body wherein said body is subjected to elevated temperatures, the method of limiting the thermal degradation of minority carrier lifetime which comprises fabricating said body of monocrystalline silicon having an initial minority carrier lifetime of at least five microseconds to a thickness of less than 10 mils, and subsequently subjecting said body to temperatures in excess of 750° C.

No references cited.